(12) United States Patent
Lin et al.

(10) Patent No.: US 8,405,201 B2
(45) Date of Patent: Mar. 26, 2013

(54) THROUGH-SILICON VIA STRUCTURE

(75) Inventors: Yung-Chi Lin, Su-Lin (TW); Weng-Jin Wu, Hsinchu (TW); Shau-Lin Shue, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 159 days.

(21) Appl. No.: 12/836,720

(22) Filed: Jul. 15, 2010

(65) Prior Publication Data

US 2011/0108986 A1 May 12, 2011

Related U.S. Application Data

(60) Provisional application No. 61/259,409, filed on Nov. 9, 2009.

(51) Int. Cl.
 *H01L 23/48* (2006.01)
(52) U.S. Cl. .. 257/698; 257/751; 257/774; 257/E23.011
(58) Field of Classification Search ................. 257/698, 257/751, 761, 763, 764, 774, E23.011; 438/667
 See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,214,731 B1 | 4/2001 | Nogami et al. | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,548,395 B1 | 4/2003 | Woo et al. | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,867,135 B1 | 3/2005 | Bao et al. | |
| 6,881,665 B1 * | 4/2005 | Tsui et al. | 438/637 |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |

(Continued)

OTHER PUBLICATIONS

OA from corresponding application No. CN 201010543649.X, dated Apr. 1, 2012.

*Primary Examiner* — Tuan N. Quach
(74) *Attorney, Agent, or Firm* — Lowe Hauptman Ham & Berner, LLP

(57) ABSTRACT

A semiconductor substrate has a front surface and a back surface, and a TSV structure is formed to extend through the semiconductor substrate. The TSV structure includes a metal layer, a metal seed layer surrounding the metal layer, a barrier layer surrounding the metal seed layer, and a block layer formed in a portion sandwiched between the metal layer and the metal seed layer. The block layer includes magnesium (Mg), iron (Fe), cobalt (Co), nickel (Ni), titanium (Ti), chromium (Cr), tantalum (Ta), tungsten (W), cadmium (Cd), or combinations thereof.

20 Claims, 7 Drawing Sheets

U.S. PATENT DOCUMENTS

| | | |
|---|---|---|
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,521,360 B2 | 4/2009 | Halahan et al. |
| 7,625,788 B2 * | 12/2009 | Chen et al. .................. 438/158 |
| 7,892,972 B2 | 2/2011 | Akram et al. |
| 8,097,955 B2 * | 1/2012 | Zimmermann et al. ...... 257/777 |
| 2006/0250080 A1 * | 11/2006 | Yamazaki et al. ............ 313/506 |
| 2008/0113505 A1 * | 5/2008 | Sparks et al. ................ 438/637 |
| 2008/0303170 A1 * | 12/2008 | Tanida et al. ................. 257/774 |
| 2009/0236746 A1 * | 9/2009 | Kitamura et al. ............. 257/751 |
| 2010/0130002 A1 * | 5/2010 | Dao et al. ..................... 438/628 |
| 2010/0230818 A1 * | 9/2010 | Birner et al. ................. 257/751 |

* cited by examiner

THROUGH-SILICON VIA STRUCTURE

CROSS REFERENCES TO RELATED APPLICATION

The present application claims priority of U.S. Provisional Patent Application Ser. No. 61/259,409, filed on Nov. 9, 2009, which is incorporated herein by reference in its entirety. Further, this application relates to the following commonly-assigned U.S. patent application Ser. No. 61/186,575, filed Jun. 12, 2009, and entitled "Through-Silicon Via Structure And A Process For Forming The Same;" which is hereby incorporated herein by reference in its entirety.

TECHNICAL FIELD

This disclosure relates to stacked integrated circuits, and particularly to a through-silicon via structure and a method of forming thereof used in three-dimensional stacking technology.

BACKGROUND

Three-dimensional (3D) wafer-to-wafer, die-to-wafer or die-to-die vertical stack technology seeks to achieve the long-awaited goal of vertically stacking many layers of active IC devices such as processors, programmable devices and memory devices to shorten average wire lengths, thereby reducing interconnect RC delay and increasing system performance. One major challenge of 3D interconnects on a single wafer or in a die-to-wafer vertical stack is the through-silicon via (TSV) that provides a signal path for high impedance signals to traverse from one side of the wafer to the other. The through-silicon via (TSV) is typically fabricated to provide a through-silicon via filled with a conducting material that passes completely through the layer to contact and connect with the other TSVs and conductors of the bonded layers. In general, Copper has become the metal of choice for the metallization of TSVs because copper has a lower electrical resistivity than most commonly used metals and a higher current carrying capacity. These characteristics are important for supporting the higher current densities experienced at high levels of integration and increased device speed. Further, copper has a good thermal conductivity and is available in a highly pure state. Reliably producing the TSV is one of the key technologies for the three-dimensional stacking technology. Therefore, there is a great amount of ongoing effort being directed to the formation of void-free features. Previous attempts at filling the TSV with a high aspect ratio, greater than 3:1, use a copper electroplating process, followed by a material removal technique, such as chemical mechanical polishing (CMP), to planarize and remove the excess metal or overburden from the top surface of the wafer, leaving conductive material only in the TSV. The deposition of some overburden thickness onto the top surface or field regions of the wafer surface will cause a long CMP process time. Also, the copper electroplating process often produces TSVs with defects such as voids or seams created within the conductive plug. The voids or seams may cause a series of problems during the fabrication of electronic devices.

BRIEF DESCRIPTION OF THE DRAWINGS

The objects, features and advantages of exemplary embodiments will become apparent by referring to the following detailed description of the embodiments with reference to the accompanying drawings, wherein.

DETAILED DESCRIPTION

Figure 1:
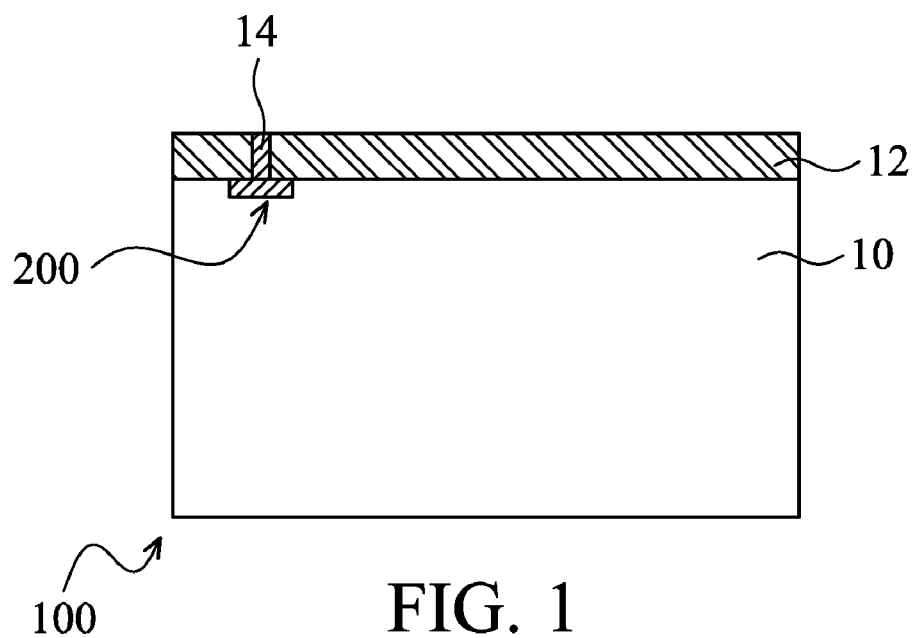
FIGS. 1 to 5, 5A to 5C, 6, and 7 are cross-sectional diagrams illustrating an exemplary embodiment of a TSV process.

Various embodiments provide a metallization process for filling a high aspect ratio opening and a structure formed using the same. The term "aspect ratio" is intended to describe a height-to-width ratio of any opening formed in a material layer. The term "high aspect ratio" in this disclosure refers to a height-to-width ratio of an opening greater than 5. Various embodiments of the metallization process are also applicable in forming a through-silicon via (TSV) structure. As used throughout this disclosure, the term "through-silicon via (TSV)" refers to an opening filled with a conductive material passing through at least a part of a semiconductor substrate or a silicon-containing substrate. Embodiments provide the use of copper metallization in forming TSVs as well as the use of copper electroplating techniques to fill high aspect ratio openings to avoid a seam or void defect. As employed throughout this disclosure, copper (Cu) is intended to encompass elemental Cu as well as Cu-based alloys substantially exhibiting the electrical properties of Cu.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 6:
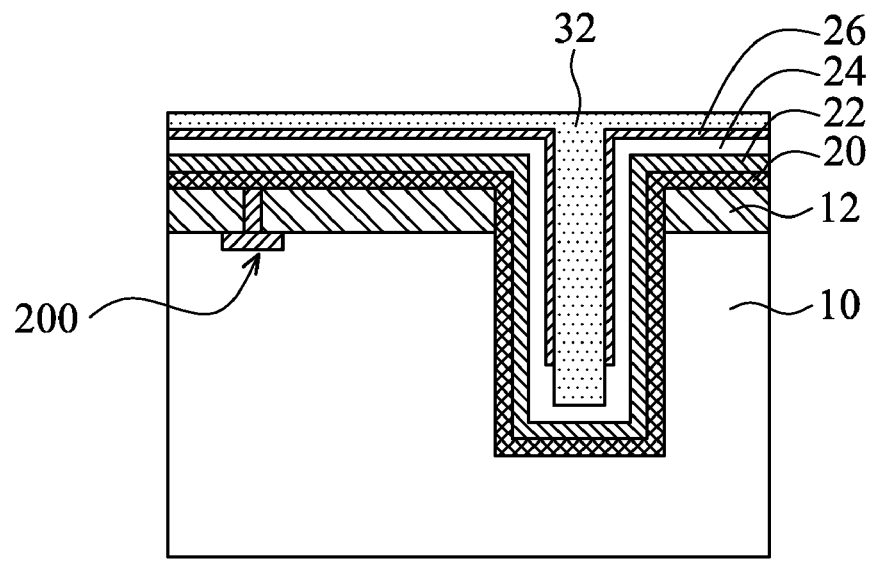
Figure 7:
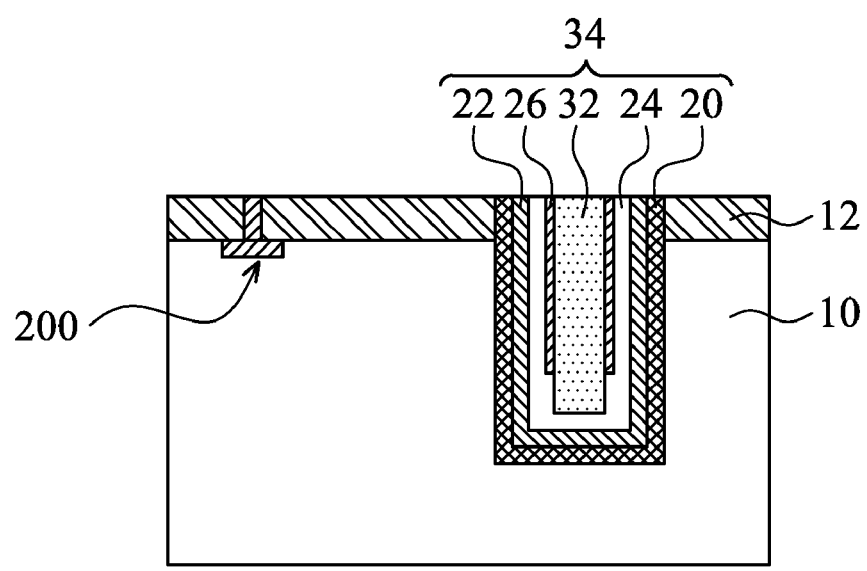
Figure 8:
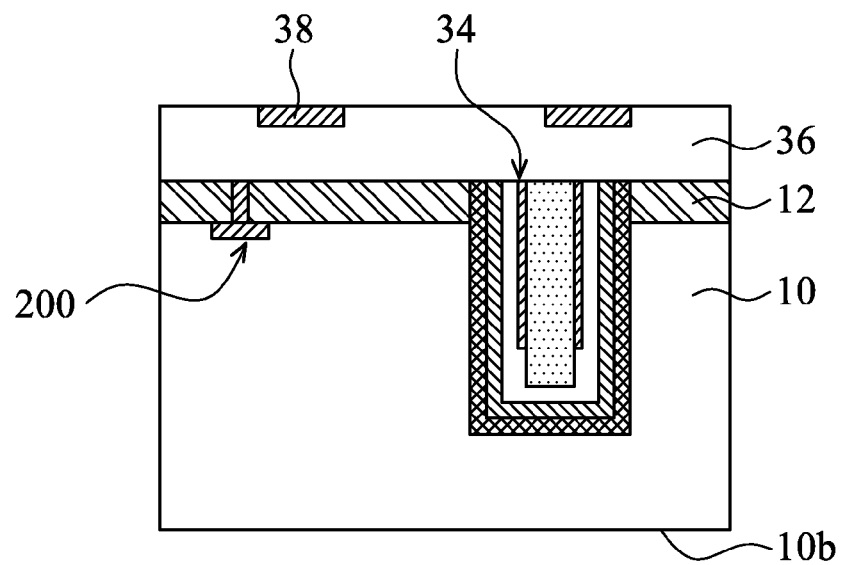
FIGS. 8 to 10 are cross-sectional diagrams illustrating an exemplary embodiment of a three-dimensional stacking process using the TSV structure.
Figure 9:
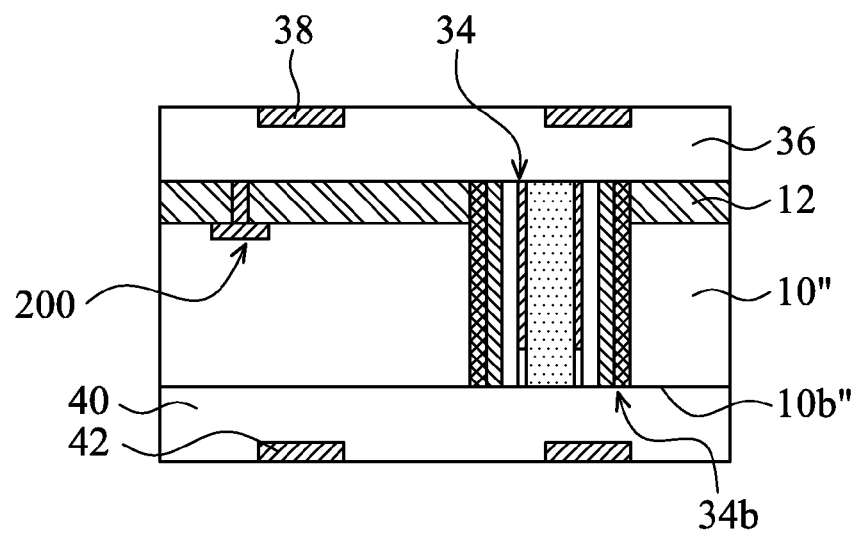
Figure 10:
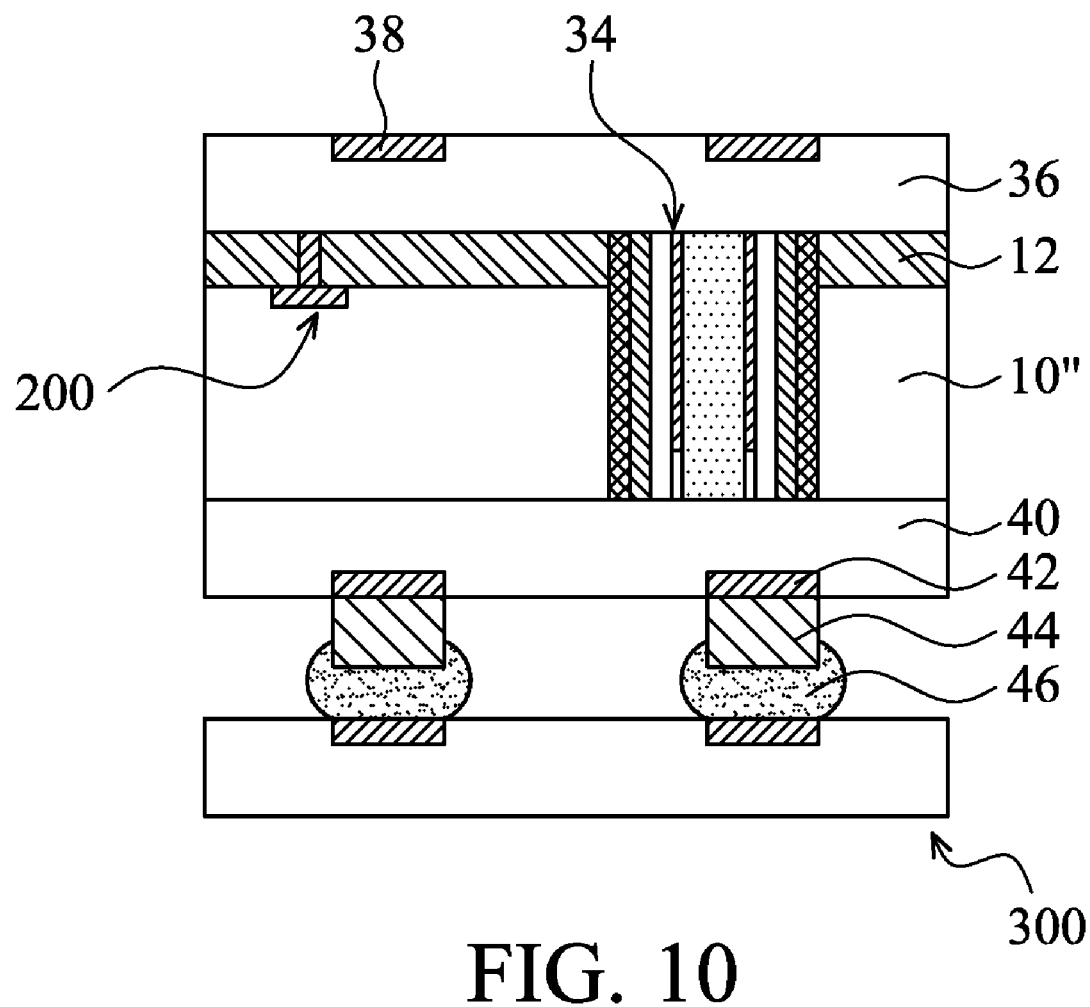

Herein, cross-sectional diagrams of FIG. 1~FIG. 7 illustrate an exemplary embodiment of a TSV process, and cross-sectional diagrams of FIG. 8~FIG. 10 illustrate an exemplary embodiment of a three-dimensional stacking process using the TSV structure.

With reference now to FIG. 1, there is shown a cross-sectional diagram of a wafer 100 comprising a semiconductor substrate 10, an IC component 200 processed from the substrate 10, an inter-layer dielectric (ILD) layer 12 overlying the semiconductor substrate 10, and a contact plug 14 formed in the ILD layer 12 electrically connected with the IC component 200. In detail, the substrate 10 is typically silicon (Si), for example, a silicon substrate with or without an epitaxial layer, or a silicon-on-insulator substrate containing a buried insulator layer. The substrate 10 has a front surface 10a (e.g., circuit side) and a back surface 10b (e.g., non-circuit side). The IC component 200 formed in and/or on the front surface 10a of the substrate 10 may comprise multiple individual circuit elements such as transistors, diodes, resistors, capacitors, inductors, and other active and passive semiconductor devices formed by conventional processes known in the integrated circuit manufacturing art. The ILD layer 12 is formed on the substrate 10 so as to isolate the IC component 200 from a subsequent formation of an interconnection structure. The ILD layer 12 may be a single layer or a multi-layered structure. The ILD layer 12 may be a silicon oxide containing layer formed of doped or undoped silicon oxide by a thermal chemical vapor deposition (CVD) process or high-density plasma (HDP) process, e.g., undoped silicate glass (USG), phosphorous doped silicate glass (PSG) or borophosphosilicate glass (BPSG). Alternatively, the ILD layer 12 may be formed of doped or P-doped spin-on-glass (SOG), PTEOS, or BPTEOS. Following a dry etching process carried out, a contact hole is formed in the ILD layer 12, and a conductive material layer is deposited to fill the contact hole, forming a contact plug 14. The contact plug 14 may include tungsten, tungsten-containing alloys, copper, copper-containing alloys or combinations thereof.

Figure 2:
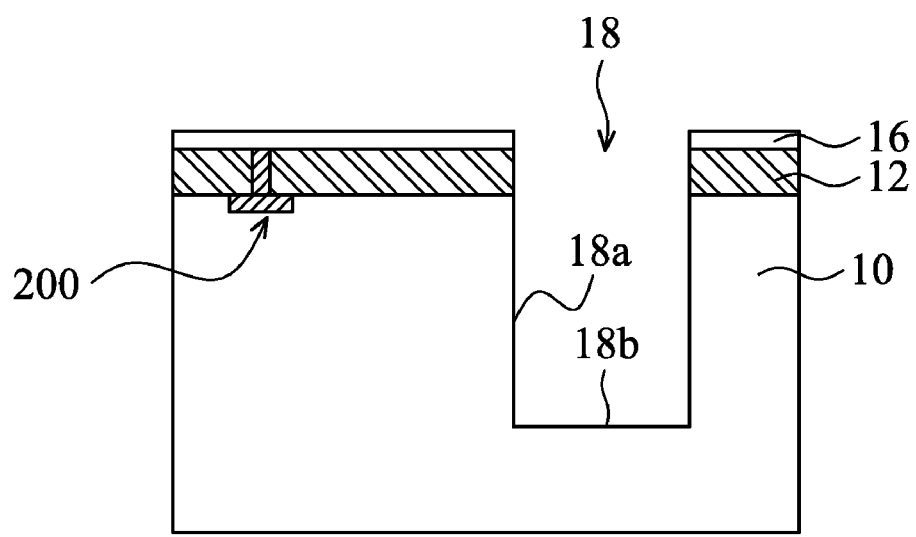

Referring to FIG. 2, the process proceeds to the formation of an opening 18 with a high aspect ratio greater than 5 in the substrate 10. In an embodiment of forming a TSV structure, the opening 18 is a TSV opening in which a metallization process will be performed. In defining the TSV opening 18, a hard mask layer 16 is formed on the ILD layer 12 followed by forming a patterned photoresist layer thereon. The hard mask layer 16 may be a silicon nitride layer, a silicon oxynitride layer or the like. The photoresist layer (not shown) is patterned by exposure, bake, developing, and/or other photolithography processes known in the art to provide an opening exposing the hard mask layer 16. The exposed hard mask layer 16 is then etched, by a wet etch or dry etch process, using the patterned photoresist layer as a masking element to provide an opening. Using the hard mask layer 16 and the patterned photoresist layer as mask elements, an etching process is performed to etch the exposed substrate 10, forming the TSV opening 18 with sidewalls 18a and a bottom 18b. The TSV opening 18 passes through at least a portion of the semiconductor substrate 10. The TSV opening 18 may be etched using any suitable etching method including, for example, plasma etch, a chemical wet etch, a laser drill, and/or other processes known in the art. In an embodiment, the etching process includes a deep reactive ion etching (RIE) process to etch the semiconductor substrate 10. The etching process may be such that the TSV opening 18 is etched from the front surface 10a to reach approximately tens of micron~hundreds of micron in depth without passing through the back surface 10b. The etching process may result in an opening having a vertical sidewall profile or a tapered sidewall profile. In an embodiment, the TSV opening 18 has a depth of approximately 20~100 μm, and a diameter of approximately 1.5~10 μm. The TSV opening 18 has a high aspect ratio between approximately 5 and approximately 10. In some embodiments, the aspect ratio of the TSV opening 18 is greater than 10.

Figure 3:
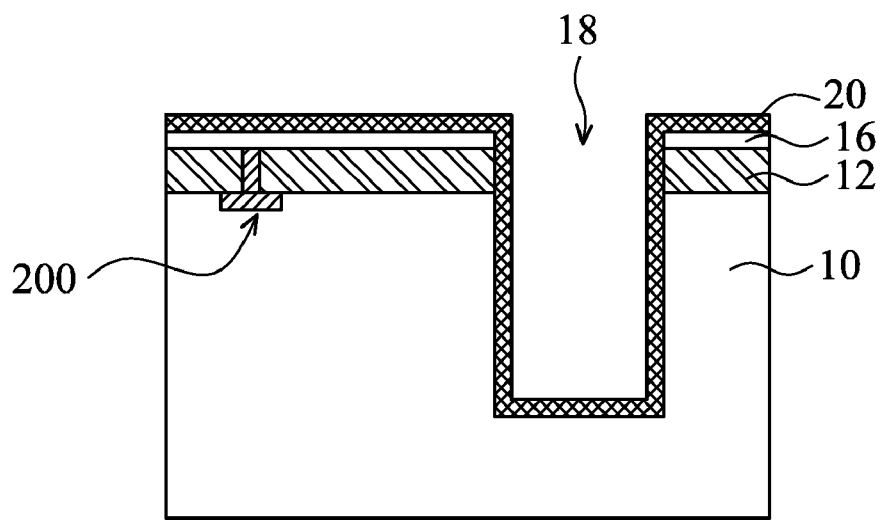

In FIG. 3, a passivation layer 20 is conformally deposited on the resulted structure to cover the hard mask layer 16 and line the sidewalls 18a and bottom 18b of the TSV opening 18 in order to prevent any conducting material from leaching into any active portions of the circuitry of the wafer 100. The passivation layer 20 may be formed of silicon oxide, TEOS oxide, silicon nitride, combinations thereof, or the like. The deposition can be carried out using any of a variety of techniques, including thermal oxidation, LPCVD (low-pressure chemical vapor deposition), APCVD (atmospheric-pressure chemical vapor deposition), PECVD (plasma-enhanced chemical vapor deposition) and future-developed deposition procedures. For example, an LPCVD or PECVD process with tetraethylorthosilicate (TEOS) and $O_3$ may be employed to form a TEOS oxide film.

Figure 4:
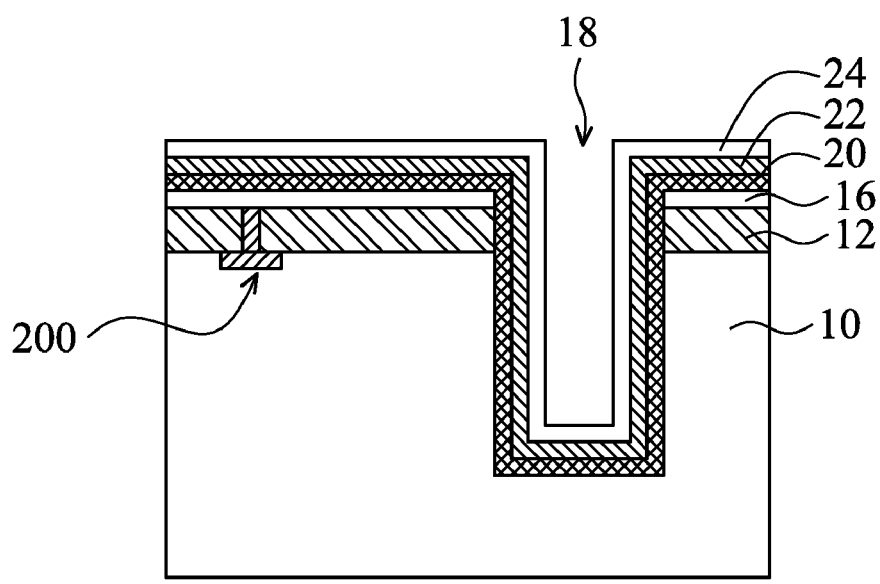

In FIG. 4, a barrier layer 22 is then formed on the passivation layer 20, lining the TSV opening 18. The barrier layer 22 functions as a diffusion barrier to prevent metal diffusion and as an adhesion layer between metal and dielectric. Refractory metals, refractory metal-nitrides, refractory metal-silicon-nitrides and combinations thereof are typically used for the barrier layer 22. For example, TaN, Ta, Ti, TiN, TiSiN, WN, or combinations thereof may be used. In an embodiment, the barrier layer 22 includes a TaN layer and a Ta layer. In another embodiment, the barrier layer 22 is a TiN layer. In another embodiment, the barrier layer 22 is a Ti layer. Subsequently, a metal seed layer 24 is formed on the barrier layer 22. In an embodiment, the metal seed layer is a copper seed layer 24 that may be formed by physical vapor deposition. Other methods for forming copper seed layer 24, such as CVD are known in the art.

Figure 5:
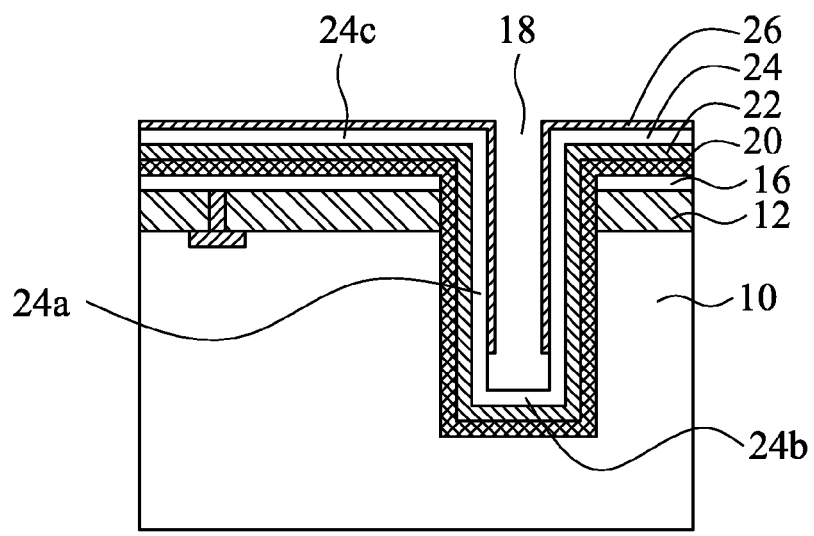
Figure 5A:
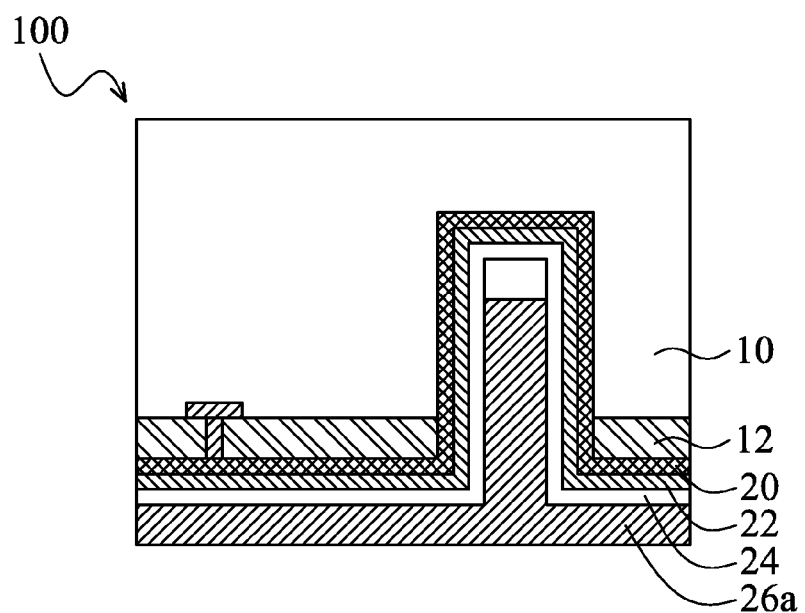
Figure 5B:
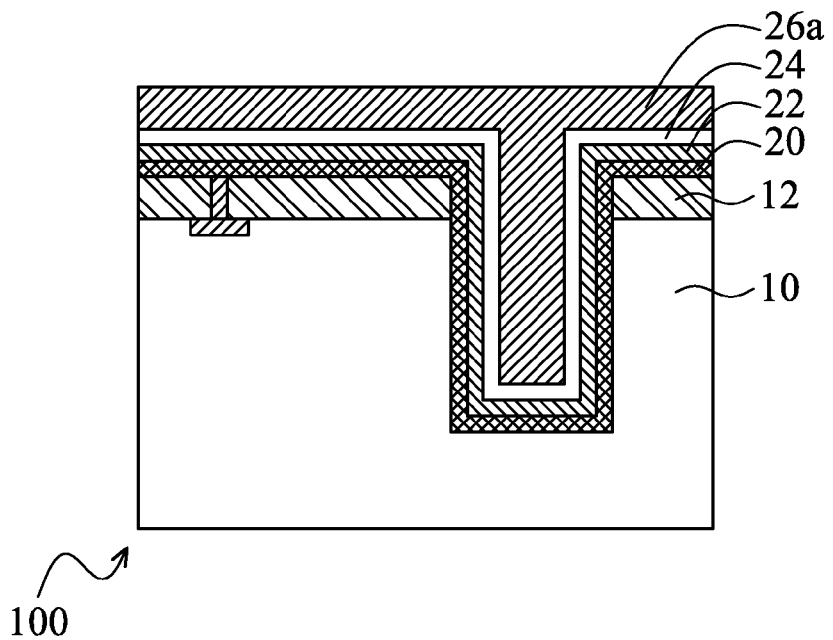
Figure 5C:
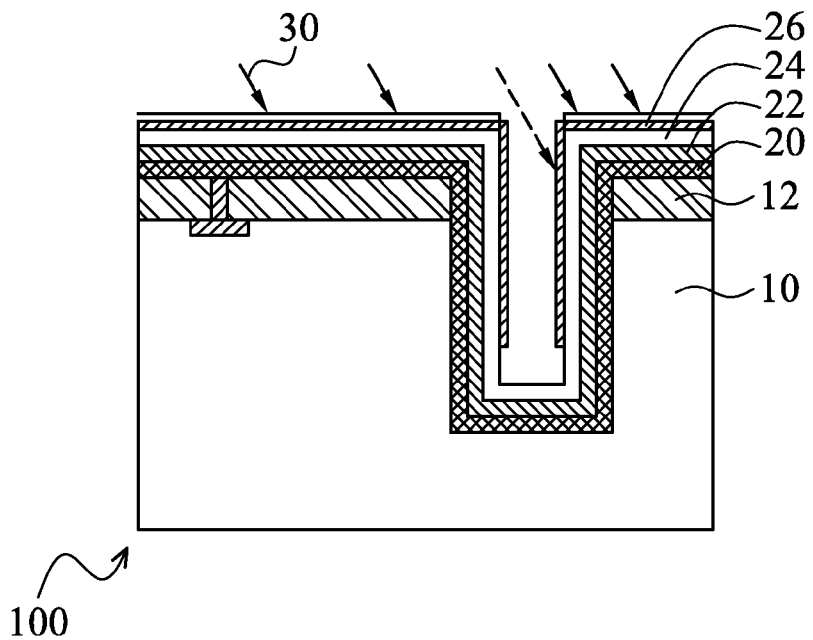

Referring to FIG. 5, a block layer 26 is formed on a portion of the metal seed layer 24. The block layer 26 is a metal layer or an alloy layer including magnesium (Mg), iron (Fe), cobalt (Co), nickel (Ni), titanium (Ti), chromium (Cr), tantalum (Ta), tungsten (W), cadmium (Cd), or combinations thereof by using an electroplating process or a PVD process. For example, the block layer 26 may be an Mn layer, an Mn-containing layer, or Mn-based layer such as formed of Mn, or various suitable compounds. The block layer 26 may be less than 10 Angstroms. In an embodiment, when a copper seed layer 24 is deposited to provide sidewall portions 24a adjacent the sidewalls 18a of the TSV opening 18, a bottom portion 24b adjacent the bottom 18b of the TSV opening 18 and a surface portion 24c outside the TSV opening 18. The block layer 26 is formed on the surface portion 24c and at least a portion of the sidewall portions 24a. By controlling operation conditions, the block layer 26 can be selectively formed on the sidewall portions 24a and/or the surface portion 24c of the metal seed layer 24, without being formed on the bottom portion 24b of the metal seed layer 24. FIG. 5A depicts an exemplary embodiment of forming a block layer 26 using an electroplating process, in which the wafer 100 is flipped so that the front surface 10a of the substrate 10 face down in the electroplating bath 26a, thus trapping air at the bottom portion 24b. FIG. 5B depicts another exemplary embodiment of forming a block layer 26 using an electroplating process with no additive in the electroplating bath 26a to make the field deposition rate much higher than the bottom deposition rate. The electrolyte may flow into via bottom, but the thin metal seed layer has higher resistance at the via bottom while depositing the block layer 26. By controlling operation conditions, the bottom portion 24b may be free of the block layer 26. FIG. 5C depicts another exemplary embodiment of forming a block layer 26 using a PVD method with a tilted pitch-angle 30 to the plasma, which makes the bottom portion 24b free of the block layer 26.

Referring to FIG. 6, the wafer 100 is transferred to a plating tool, such as an electrochemical plating (ECP) tool, and a metal layer 32 is plated on the wafer 100 by the plating process to fill the TSV opening 18. While ECP process is described herein, the embodiment is not limited to ECP deposited metal. The metal layer 32 may include a low resistivity conductor material selected from the group of conductor materials including, but is not limited to, copper and copper-based alloy. Alternatively, the metal layer may comprise various materials, such as tungsten, aluminum, gold, silver, and the like. In an embodiment, the metal layer 32 is a copper-containing layer formed over the copper seed layer 24, and the block layer 26 is sandwiched there between. With the formation of the block layer 26 formed on the sidewall portions 24a but not on the bottom portion 24b, the copper electroplating process can run faster and fill from the bottom-up the TSV opening 18 to form a void-free metallization structure. This provides a reliable solution with high throughput for filling the high aspect ratio opening. This leads to significant savings in copper plating and subsequent polishing time, and thus savings in manufacturing costs of 3D-stacked integrated circuits.

Subsequently, as shown in FIG. 7, the excess portions of the metal layer 32, the block layer 26, the metal seed layer 24, the barrier layer 22, the passivation layer 20 and/or the hard mask layer 16 outside the TSV opening 18 are removed, either through etching, chemical mechanical polishing (CMP), or the like, forming the upper surface of the metal-filed opening substantially coplanar with the upper surface of dielectric layer 12. The wafer 100 now comprises a TSV structure 34 formed in the ILD layer 12 and extending through a portion of the substrate 10. The TSV structure 34 includes the metal layer 32, the metal seed layer 24 surrounding the metal layer 32, the barrier layer 22 surrounding the metal seed layer 24, the passivation layer 20 surrounding the barrier layer 22, and the block layer 26 formed in a portion sandwiched between the metal seed layer 24 and the metal layer 32.

Next, back-end-of-line (BEOL) interconnection technologies are processed on the wafer 100 to fabricate an interconnection structure including a plurality of interconnection layers, redistribution layers, inter-metal dielectric (IMD) layers 36 and bonding contacts 38 as illustrated in FIG. 8. In an embodiment, a first-level interconnection layer is formed in an IMD layer to electrically connect with the contact plug 14 and the TSV structure 34 respectively, and thereafter another level interconnection layers and IMD layers are fabricated on the first-level interconnection layer, which are omitted in the drawings for clarity and convenience. Bonding contacts 38 are formed overlying a completed top-level interconnect layer and a top-level IMD layer. Copper-based conductive materials for forming the interconnection layers and the bonding contacts 38. The copper-based conductive material is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. A standard damascene process may be used with the copper BEOL interconnection.

Referring to FIG. 9, the wafer 100 then undergoes a wafer thinning process and a backside metallization process. In an embodiment, the wafer 100 is attached to a carrier, and then the back surface 10b of the substrate 10 is processed to the desired final thickness, exposing the bottom end 34b of the TSV structure 34. This can be done, for example, through grinding, etching, and/or polishing, resulting in a thinned substrate 10" with a predetermined thickness depending on the purpose for which the semiconductor package is used. The thinned substrate 10" may have a thickness of from about 5 µm to about 180 µm. In an exemplary embodiment, the bottom 34b of the TSV structure 34 is exposed and/or protruded from the back surface 10b" of the thinned substrate 10" after the wafer thinning process. Backside metallization including electrical connections and/or other structures are formed on the back surface 10b" of the thinned substrate 10", including a backside dielectric layer 40 and bonding pads 42 for connecting external dies or a wafer. In FIG. 10, an external die or wafer 300 are bonded onto the wafer 100 wherein the bonding methods include commonly used methods such as oxide-to-oxide bonding, oxide-to-silicon bonding, copper-to-copper bonding, copper-to-solder bonding, adhesive bonding, or combinations thereof. In an embodiment, external contacts 44 of the individual semiconductor chips can be formed on the bonding pads 42 on the back surface 10b" of the thinned substrate 10" respectively for bonding to electrical terminals. The external contacts 44 may be solder bumps, copper-containing bumps or combinations thereof. A plurality of connecting elements 46 may be further provided so as to bond external dies 300 onto the wafer 100, forming a dies-to-wafer stack. The connecting elements may be solder bumps, copper-containing bumps or combinations thereof. After dicing, the stacked chip or chips are mounted on an IC card through, for example, an anisotropically conductive connection film.

Although embodiments of the disclosure have been described, these embodiments are not intended to limit the disclosure to the precise embodiments disclosed herein. Those skilled in this technology can still make various alterations and modifications without departing from the scope and spirit of this disclosure.

What is claimed is:

1. An integrated circuit device, comprising:
a semiconductor substrate having a front surface and a back surface with an integrated circuit (IC) component formed on the front surface;
an interlayer dielectric (ILD) layer formed overlying the front surface of the semiconductor substrate;
a contact plug formed in the ILD layer and electrically connected to the IC component; and
a via structure formed in the ILD layer and extending through the semiconductor substrate, wherein the via structure comprises
a metal layer,
a metal seed layer surrounding the metal layer and having a sidewall,
a barrier layer surrounding the metal seed layer, and
a block layer sandwiched between the metal layer and the metal seed layer and extending along only a portion of the sidewall of the metal seed layer; and
wherein the block layer comprises at least one of magnesium (Mg), iron (Fe), cobalt (Co), nickel (Ni), titanium (Ti), chromium (Cr), tantalum (Ta), tungsten (W), or cadmium (Cd).

2. The integrated circuit device of claim 1, wherein the metal seed layer comprises a bottom portion adjacent to the back surface of the semiconductor substrate, and the bottom portion of the metal seed layer is free of the block layer.

3. The integrated circuit device of claim 1, wherein the metal layer comprises copper, and the metal seed layer comprises copper.

4. The integrated circuit device of claim 1, wherein the barrier layer comprises at least one of TaN, Ta, TiN, or Ti.

5. The integrated circuit device of claim 1, wherein the via structure further comprises a passivation layer surrounding the barrier layer.

6. The integrated circuit device of claim 5, wherein the passivation layer comprises silicon oxide.

7. The integrated circuit device of claim 1, wherein the via structure includes an end that is exposed on the back surface of the semiconductor substrate.

8. The integrated circuit device of claim 1, further comprising a semiconductor component stacked on the back surface of the semiconductor substrate and electrically connected to the via structure.

9. A semiconductor device, comprising:
a semiconductor substrate having a front surface and a back surface with an integrated circuit (IC) component formed on the front surface;
an interlayer dielectric (ILD) layer formed overlying the front surface of the semiconductor substrate;

a contact plug formed in the ILD layer and electrically connected to the IC component; and a via structure formed in the ILD layer and extending through the semiconductor substrate;

wherein the via structure comprises a copper layer, a copper seed layer surrounding the copper layer and having a sidewall, a barrier layer surrounding the copper seed layer, and a manganese (Mn) layer sandwiched between the copper layer and the copper seed layer and extending along only a portion of the sidewall of the copper seed layer; and wherein the via structure comprises an end that is exposed on the back surface of the semiconductor substrate.

10. The semiconductor device of claim 9, wherein the barrier layer comprises at least one of TaN, Ta, TiN, or Ti.

11. The semiconductor device of claim 9, further comprising a passivation layer surrounding the barrier layer.

12. The semiconductor device of claim 11, wherein the passivation layer comprises silicon oxide.

13. The semiconductor device of claim 9, further comprising a backside dielectric layer formed overlying the back surface of the semiconductor substrate; and an external contact formed on the backside dielectric layer.

14. The semiconductor device of claim 13, wherein the external contact comprises solder bumps, copper-containing bumps or combinations thereof.

15. An integrated circuit (IC) device, comprising:

a substrate having an opening defined therein, a front surface, a back surface, and an IC component formed on the front surface, the opening extending from the front surface of the substrate to the back surface;

an interconnection structure over the front surface of the substrate and electrically coupled to the IC component; and a via structure in the opening, extending through the substrate, and electrically coupled to the interconnection structure, the via structure comprising:

a metal layer;

a metal seed layer surrounding the metal layer and having a sidewall;

a barrier layer surrounding the metal seed layer; and a block layer sandwiched between the metal layer and the metal seed layer and extending along only a portion of the sidewall of the metal seed layer, the block layer comprises a material including manganese (Mn), magnesium (Mg), iron (Fe), cobalt (Co), nickel (Ni), titanium (Ti), chromium (Cr), tantalum (Ta), tungsten (W), or cadmium (Cd).

16. The IC device of claim 15, wherein the via structure further comprises a passivation layer between the barrier layer and a sidewall of the opening.

17. The IC device of claim 16, wherein the passivation layer comprises silicon oxide.

18. The IC device of claim 15, wherein the metal seed layer comprises a bottom portion adjacent to the back surface of the substrate, and the block layer is between the front surface of the substrate and the bottom portion of the metal seed layer.

19. The IC device of claim 15, wherein the metal layer comprises copper, and the metal seed layer comprises copper.

20. The IC device of claim 15, wherein the barrier layer comprises TaN, Ta, TiN, or Ti.

* * * * *